US010014760B2

(12) United States Patent
Baranwal et al.

(10) Patent No.: US 10,014,760 B2
(45) Date of Patent: Jul. 3, 2018

(54) SOFT-START SWITCH CIRCUIT (71) Applicant: TEXAS INSTRUMENTS INCORPORATED, Dallas, TX (US)

(72) Inventors: Shailendra Kumar Baranwal, Murphy, TX (US); Alan Stephen Bass, Plano, TX (US); Vighnesh Rudra Das, Dallas, TX (US); Anant Shankar Kamath, Plano, TX (US); Abhijeeth Aarey Premanath, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/395,370

(22) Filed: Dec. 30, 2016

(65) Prior Publication Data

US 2018/0091034 A1 Mar. 29, 2018

Related U.S. Application Data (60) Provisional application No. 62/398,956, filed on Sep. 23, 2016.

(51) Int. Cl.
*H02M 1/08* (2006.01)
*H02M 3/335* (2006.01)

(52) U.S. Cl.
CPC .......... *H02M 1/08* (2013.01); *H02M 3/33515* (2013.01)

(58) Field of Classification Search
CPC ............ H02M 1/08; H02M 1/36; H02M 1/42; H02M 3/33507; H02M 3/33523; H02M 3/33561; H02M 3/33569; H02M 3/33576; H02M 3/33592; H02M 2001/0032; H02M 11/00
USPC ....................................... 363/21.01–21.18, 49
See application file for complete search history.

(56) References Cited

U.S. PATENT DOCUMENTS

| 6,643,145 | B1 * | 11/2003 | Harrison | ............... | H02M 3/157 363/16 |
| 2008/0136341 | A1 * | 6/2008 | Araki | ............... | H02M 1/36 315/209 R |
| 2014/0002185 | A1 * | 1/2014 | Feldtkeller | ............... | G05F 1/56 327/581 |
| 2015/0256060 | A1 * | 9/2015 | Faingersh | ............... | H02M 1/36 323/267 |

* cited by examiner

*Primary Examiner* — Yemane Mehari
(74) *Attorney, Agent, or Firm* — John R. Pessetto; Charles A. Brill; Frank D. Cimino (57) ABSTRACT One example includes a switch circuit. The switch circuit includes a transistor configured to activate in response to an activation voltage at an activation terminal of the transistor. The switch circuit also includes a current source coupled to the activation terminal and being configured to generate an activation current. The switch circuit further includes a driver control circuit interconnecting the activation terminal and a voltage rail. The driver control circuit includes digital counter logic configured to cycle through a predetermined number of count values based on an oscillator signal. The driver control circuit is configured to adjust an amplitude of the activation voltage at each of the predetermined number of count values based on the activation current to provide a soft-start activation of the transistor.

15 Claims, 4 Drawing Sheets

SOFT-START SWITCH CIRCUIT

RELATED APPLICATION

This application claims priority from U.S. Provisional Patent Application No. 62/398,956, filed 23 Sep. 2016, the subject matter of which is incorporated herein by reference in its entirety.

TECHNICAL FIELD

This disclosure relates generally to electronic systems, and more specifically to a soft-start switch circuit.

BACKGROUND

Power supply systems are implemented for a variety of electronic applications to convert one power voltage to another, such as from an AC power voltage to a DC power voltage or from a DC power voltage to another DC power voltage. At initiation of a power supply, activation of a switch to conduct a current, such as to charge an output capacitor, can result in a high inrush current. The high inrush current can exceed safe operating capacity of electronic devices in the power supply circuit, such as transistors associated with operating the power supply circuit. To control inrush current, circuits can be designed to provide a soft-start of the power supply circuit, such as to slowly increase the voltage at the output. Therefore, inrush current can be controlled to mitigate damage to the electronic devices of the power supply circuit.

SUMMARY

One example includes a switch circuit. The switch circuit includes a transistor configured to activate in response to an activation voltage at an activation terminal of the transistor. The switch circuit also includes a current source coupled to the activation terminal and being configured to generate an activation current. The switch circuit further includes a driver control circuit interconnecting the activation terminal and a voltage rail. The driver control circuit includes digital counter logic configured to cycle through a predetermined number of count values based on an oscillator signal. The driver control circuit is configured to adjust an amplitude of the activation voltage at each of the predetermined number of count values based on the activation current to provide a soft-start activation of the transistor.

Another example includes a switch circuit. The switch circuit includes a transistor configured to activate in response to an activation voltage at an activation terminal of the transistor. The switch circuit also includes a current source coupled to the activation terminal and being configured to generate an activation current. The switch circuit further includes a driver control circuit interconnecting the activation terminal and a voltage rail. The driver control circuit includes a first current path for the activation current interconnecting the activation terminal and the voltage rail, and a second current path for the activation current in parallel with the first current path and being configured to conduct a variable portion of the activation current in response to an oscillator signal to adjust the amplitude of the activation voltage to provide a soft-start activation of the transistor.

Another example includes a power supply circuit. The system includes a driver circuit that includes at least one switch circuit. Each of the at least one switch circuit includes a transistor configured to activate in response to an activation voltage at an activation terminal of the transistor to provide a primary current through the transistor, and a current source coupled to the activation terminal and being configured to generate an activation current. Each of the at least one switch circuit also includes a driver control circuit interconnecting the activation terminal and a voltage rail. The driver control circuit includes digital counter logic configured to cycle through a predetermined number of count values based on an oscillator signal. The driver control circuit is configured to adjust an amplitude of the activation voltage at each of the predetermined number of count values based on the activation current to provide a soft-start activation of the transistor. The circuit also includes a transformer comprising a primary winding configured to conduct the primary current and a secondary winding configured to generate a secondary current in response to the primary current. The circuit further includes an output stage configured to generate an output voltage based on the secondary current.

DETAILED DESCRIPTION

This disclosure relates generally to electronic systems, and more specifically to a soft-start switch circuit. The soft-start switch circuit can be implemented in a power supply circuit, such as to provide a soft-start of each of the transistors that supply current to the power supply circuit. The switch circuit includes a transistor, such as a power transistor, that is activated in response to an activation voltage at an activation terminal. As an example, the transistor can be activated to provide current through an inductor, such as the primary winding of a transformer in a push-pull transformer power supply. The switch circuit also includes a current supply that is coupled to the activation terminal of the transistor and is activated (e.g., via a switch) to provide an activation current to the activation terminal. As an example, the current supply can be activated via one state of an oscillator signal, such that a current supply in a separate switch circuit can be activated via the other state of the oscillator signal in a push-pull transformer power supply circuit.

The switch circuit further includes a driver control circuit interconnecting the activation terminal and a voltage rail (e.g., ground). The driver control circuit can include digital counter logic that is configured to cycle through a predetermined number of count values based on an oscillator signal. The driver control circuit can be configured to adjust an amplitude of the activation voltage at each of the predetermined number of count values based on the activation current to provide a soft-start activation of the transistor. As an example, the driver control circuit can include a first current path that includes a resistor and a second current path that includes a cascaded arrangement of switches. The cascaded arrangement of switches can be sequentially controlled (i.e., activated or deactivated) based on the digital counter logic to sequentially conduct a variable portion of the activation current through the second current path, and thus to adjust the portion of the activation current through the first current path to set the amplitude of the activation voltage. Therefore, the activation voltage can be controlled to provide a slow adjustment of amplitude, thus providing a soft-start for the transistor.

Figure 1:
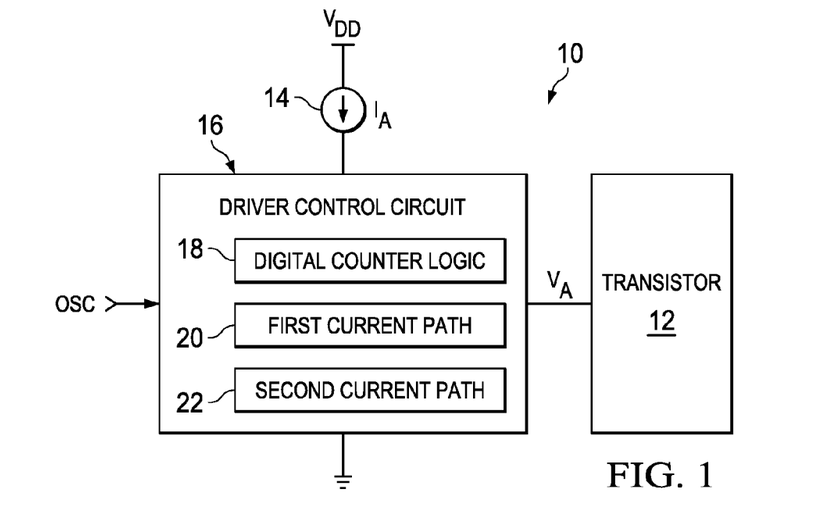
FIG. 1 illustrates an example of a switch circuit.

FIG. 1 illustrates an example of a switch circuit 10. The switch circuit 10 can be implemented in a variety of applications that may benefit from a soft-start activation of a transistor 12. As an example, the switch circuit 10 can correspond to one of a plurality (e.g., two) switch circuits in a power supply circuit, such as a push-pull transformer power supply circuit. The transistor 12 can correspond to any of a variety of different types of transistors or power transistors, such as N-channel or P-channel metal-oxide semiconductor field effect transistors (MOSFETs), power MOSFETs, NPN or PNP bipolar junction transistors (BJTs), or any other type of transistor.

The switch circuit 10 includes a current supply 14 that is configured to provide an activation current $I_A$ from a power rail, demonstrated as a voltage $V_{DD}$. The switch circuit 10 further includes a driver control circuit 16. The driver control circuit 16 is configured to control the activation of the transistor 12 via an activation voltage $V_A$ to provide a soft-start of the transistor 12. As described herein, the soft-start of the transistor 12 corresponds to a gradual adjustment of the activation voltage $V_A$ over time from an amplitude corresponding to shut-off of the transistor 12, such that the transistor 12 conducts zero current, to a full activation of the transistor 12. Thus, based on the gradual adjustment of the activation voltage $V_A$ over time, the transistor 12 is gradually activated to slowly increase the amplitude of the current that is conducted through the transistor 12. Accordingly, by providing a soft-start of the transistor 12, the driver control circuit 16 can substantially mitigate an inrush current associated with activation of the transistor 12.

The driver control circuit 16 includes digital counter logic 18. The digital counter logic 18 is controlled via an oscillator signal OSC to cycle through a predetermined number of count values. The driver control circuit 16 can be configured to adjust the amplitude of the activation voltage $V_A$ at each of the predetermined number of count values of the digital counter logic 18 based on the activation current $I_A$ to provide the soft-start activation of the transistor 12. In the example of FIG. 1, the driver control circuit 16 is demonstrated as including a first current path 20 and a second current path 22 associated with the activation current $I_A$. Each of the first and second current paths 20 and 22 interconnects an activation terminal of the transistor 12 (e.g., a gate of the transistor 12 configured as a MOSFET) and a low-voltage rail, demonstrated as ground. As an example, the first current path 20 can include a resistor to set the amplitude of the activation voltage $V_A$ based on an amplitude of the portion of the activation current $I_A$ that flows through the first current path 20. The second current path 22 can include a cascaded arrangement of switches that are sequentially controlled (e.g., activated or deactivated) based on the digital counter logic 18 to control an amplitude of the portion of the activation current $I_A$ that flows through the second current path 22, and thus the amplitude of the portion of the activation current that flows through the first current path 20. Accordingly, the digital counter logic 18 can incrementally and gradually adjust the amplitude of the activation voltage $V_A$ to provide the soft-start of the transistor 12.

Therefore, the driver control circuit 16 is configured to control the amplitude of the activation voltage $V_A$ of the transistor 12 based on a predetermined timer scheme, as described in greater detail herein, to substantially mitigate inrush current. As a result, the transistor 12 can be activated in a soft-start manner in a power supply circuit without implementing a feedback loop, as opposed to typical power supply circuits, thus providing the soft-start activation in a power efficient manner. Additionally, the soft-start of the transistor 12, as described herein, is implemented independently of other external or additional circuits or chips, such as soft-start schemes that implement an adjustable power voltage or soft-start schemes that rely on duty-cycle based control via an external inductor. Thus, implementing the driver control circuit 16 conserves space on a printed circuit board and reduces cost relative to soft-start schemes that implement additional external circuits or a duty-cycle based implementation.

Figure 2:
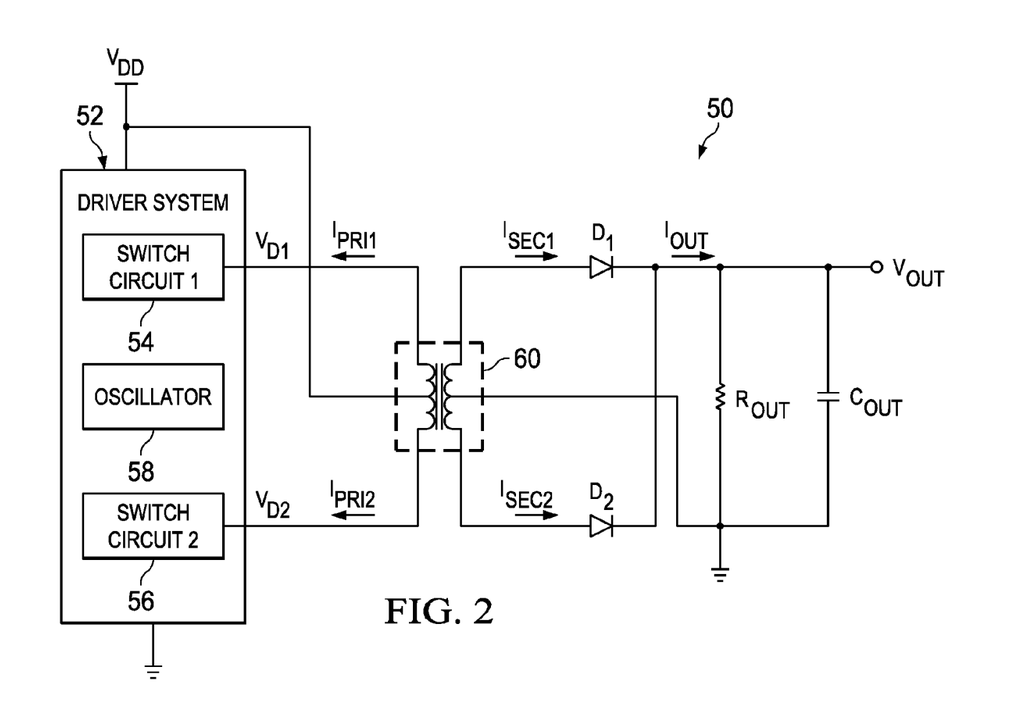
FIG. 2 illustrates an example of a power supply circuit.

FIG. 2 illustrates an example of a power supply circuit 50. The power supply circuit 50 is demonstrated in the example of FIG. 2 as a push-pull transformer power supply circuit. However, the use of the switch circuit 10 described in the example of FIG. 1 to provide a soft-start of associated transistors is not limited to use in a push-pull transformer power supply circuit, but could instead be implemented in any of a variety of power supply systems. As an example, at least a portion of the power supply circuit 50 can be arranged in an integrated circuit (IC) chip.

The power supply circuit 50 includes a driver system 52 that is arranged between a power rail voltage $V_{DD}$ and a low-voltage rail (e.g., ground). The driver system 52 includes a first switch circuit 54 that is configured to generate a first driver voltage $V_{D1}$ and a second switch circuit 56 that is configured to generate a second driver voltage $V_{D2}$. As an example, each of the first and second switch circuits 54 and 56 can be arranged substantially similar to the switch circuit 10 in the example of FIG. 1, such that the driver voltages $V_{D1}$ and $V_{D2}$ are associated with the transistor 12 in each of the respective switch circuits 54 and 56. The driver system 52 is demonstrated as also including an oscillator 58 that is configured to generate an oscillator signal, such as the oscillator signal OSC in the example of FIG. 1. However, it is to be understood that the oscillator 58 can be arranged externally with respect to the driver system 52, such as on a separate circuit that provides the oscillator signal OSC to an input of the associated IC chip.

The driver voltages $V_{D1}$ and $V_{D2}$ are provided to a primary winding of a transformer 60 having a center tap that is coupled to the power voltage $V_{DD}$. As an example, the driver voltages $V_{D1}$ and $V_{D2}$ can switch between floating voltages and low-amplitude voltages (e.g., approximately zero volts), based on the switch circuits 54 and 56. Therefore, the driver voltages $V_{D1}$ and $V_{D2}$ can provide respective primary currents $I_{PRI1}$ and $I_{PRI2}$ through the primary winding of the transformer 60 in opposite directions, respectively, in response to alternate activation of the switch circuits 54 and 56 based on the oscillator 58 (e.g., the oscillator signal OSC). The transformer 60 can thus be configured to generate secondary currents $I_{SEC1}$ and $I_{SEC2}$ in response to the respective primary currents $I_{PRI1}$ and $I_{PRI2}$ that flow in opposite directions, respectively. The secondary currents $I_{SEC1}$ and $I_{SEC2}$ are rectified via diodes $D_1$ and $D_2$, respectively, to generate an output current $I_{OUT}$ that sets an amplitude of an output voltage $V_{OUT}$ across an output resistor $R_{OUT}$ and an output capacitor $C_{OUT}$.

During initialization of the power supply circuit 50, the output capacitor $C_{OUT}$ has no electric charge. As a result, the output capacitor $C_{OUT}$ attempts to draw as much of the output current $I_{OUT}$ as possible at initialization to build the electric charge, which can result in a significant inrush current of the output current $I_{OUT}$, and thus of the secondary currents $I_{SEC1}$ and $I_{SEC2}$, and by extension, the primary currents $I_{PRI1}$ and $I_{PRI2}$. As a result, the inrush current amplitudes of the primary currents $I_{PRI1}$ and $I_{PRI2}$ can be sufficient to damage the power transistors (e.g., the transistor 12 in the example of FIG. 1). As a result, the switch circuits 54 and 56 can each include driver control circuits, such as the driver control circuit 16, to provide a soft-start of the respective transistors, and thus substantially mitigate the inrush current during initialization of the power supply circuit 50, as described herein.

Figure 3:
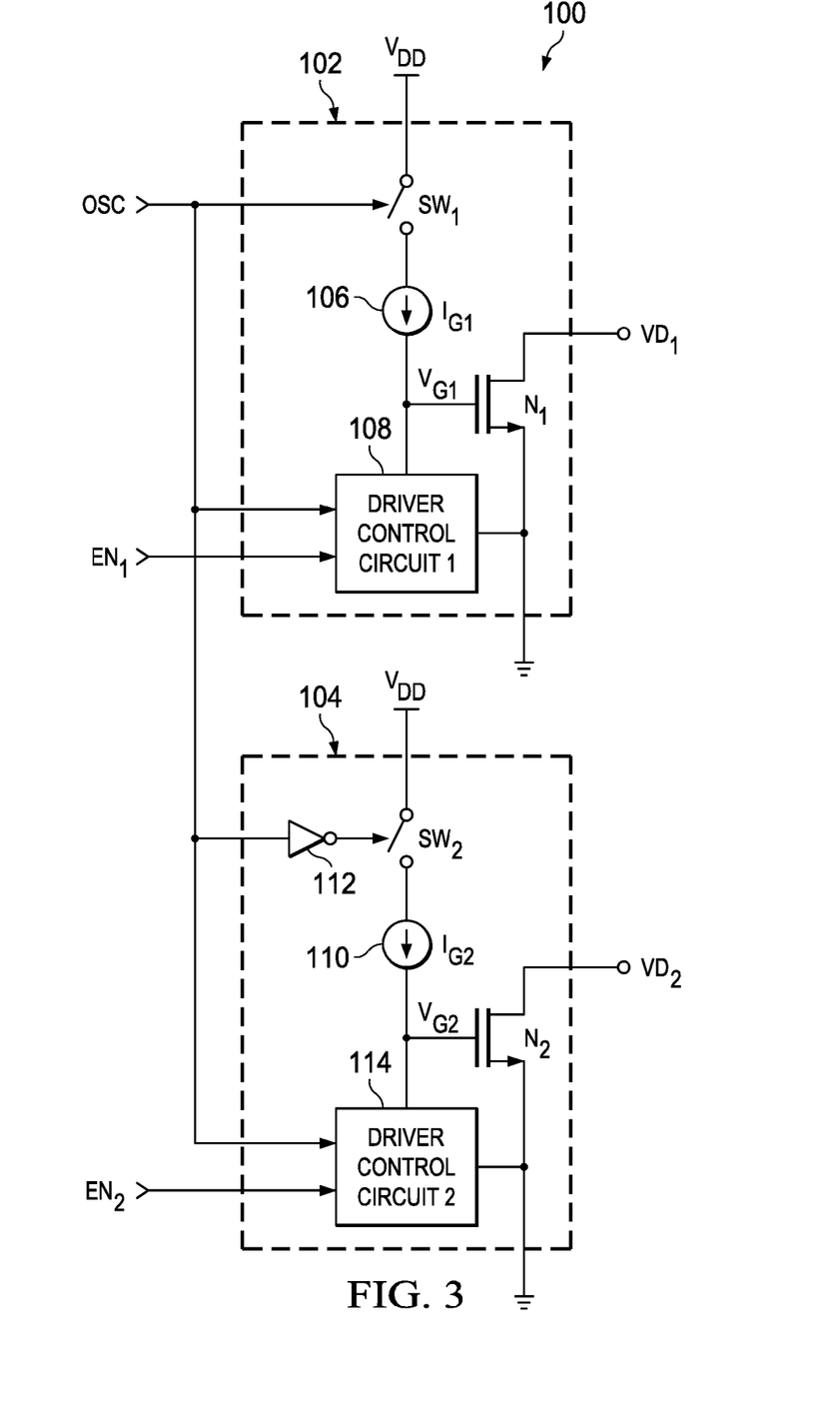
FIG. 3 illustrates an example of a driver system.

FIG. 3 illustrates an example of a driver system 100. The driver system 100 can correspond to at least a portion of the driver system 52 in the example of FIG. 2. Therefore, reference is to be made to the example of FIG. 2 in the following description of the example of FIG. 3.

The driver system 100 includes a first switch circuit 102 that is configured to control a first transistor, demonstrated as an N-channel FET $N_1$, and a second switch circuit 104 that is configured to control a second transistor, demonstrated as an N-channel FET $N_2$. The first switch circuit 102 may be coupled between the gate and source of transistor $N_1$, and the second switch circuit 104 may be coupled between the gate and source of transistor $N_2$. The first N-FET $N_1$ interconnects the first driver voltage $V_{D1}$ and a low-voltage rail (e.g., ground) and is controlled by an activation voltage $V_{G1}$. Similarly, the second N-FET $N_2$ interconnects the second driver voltage $V_{D2}$ and the low-voltage rail and is controlled by an activation voltage $V_{G2}$. Therefore, the N-FETs $N_1$ and $N_2$ correspond to power switches for providing the primary currents $I_{PRI1}$ and $I_{PRI2}$, respectively, through the transformer 60 in the example of FIG. 2.

The first switch circuit 102 includes a current supply 106 that is configured to provide an activation current $I_{G1}$ from a power rail, demonstrated as a voltage $V_{DD}$, via a first switch $SW_1$. The first switch $SW_1$ is controlled via an oscillator signal OSC, such as generated by the oscillator 58 in the example of FIG. 2. As an example, the oscillator signal OSC can be provided as an oscillating square-wave (e.g., clock signal) having a frequency of approximately 100 kHz, such that the switch $SW_1$ is activated at one logic-state of the oscillator signal OSC. The first switch circuit 102 further includes a first driver control circuit 108 that is configured to control the activation of the N-FET $N_1$ via the activation voltage $V_{G1}$ to provide the soft-start of the N-FET $N_1$. The first driver control circuit 108 is provided the oscillator signal OSC and a first enable signal $EN_1$ to control the amplitude of the activation voltage $V_{G1}$ (e.g., the gate-source voltage of transistor $N_1$) based on the activation current $I_{G1}$. As an example, the first enable signal $EN_1$ can be provided to enable the soft-start of the N-FET $N_1$, such that the first enable signal $EN_1$ can be asserted during the soft-start activation of the N-FET $N_1$, and can be de-asserted at the end of the soft-start of the N-FET $N_1$, or can remain de-asserted in response to a steady-state operation of the power supply system 50.

The second switch circuit 104 is demonstrated as configured substantially similar to the first switch circuit 106. The second switch circuit 104 includes a current supply 110 that is configured to provide an activation current $I_{G2}$ from the power rail voltage $V_{DD}$ via a second switch $SW_2$. The second switch $SW_2$ is controlled by the oscillator signal OSC via an inverter 112, such that the second switch $SW_2$ is activated at a logic-state of the oscillator signal OSC opposite the first switch $SW_1$. The second switch circuit 104 further includes a second driver control circuit 114 that is configured to control the activation of the N-FET $N_2$ via the activation voltage $V_{G2}$ to provide the soft-start of the N-FET $N_2$. The second driver control circuit 114 is provided the oscillator signal OSC and a second enable signal $EN_2$ to control the amplitude of the activation voltage $V_{G2}$ (e.g., the gate-source voltage of transistor $N_2$) based on the activation current $I_{G2}$. The second enable signal $EN_2$ can be provided to enable the soft-start of the N-FET $N_2$, similar to as described previously with respect to the first enable signal $EN_1$.

Each of the first and second driver control circuits 108 and 114 can be configured substantially similar with respect to each other, and can be configured substantially similar to the driver control circuit 16 in the example of FIG. 1. Therefore, the driver control circuits 108 and 114 can include digital counter logic controlled via the oscillator signal OSC to cycle through a predetermined number of count values. As described in greater detail with reference to FIG. 4, the amplitude of the respective activation voltages $V_{G1}$ and $V_{G2}$ is adjusted at each of the count values based on adjusting respective portions of amplitudes of the activation currents $I_{G1}$ and $I_{G2}$ through respective current paths between the gate of the respective N-FETs $N_1$ and $N_2$ and ground.

Figure 4:
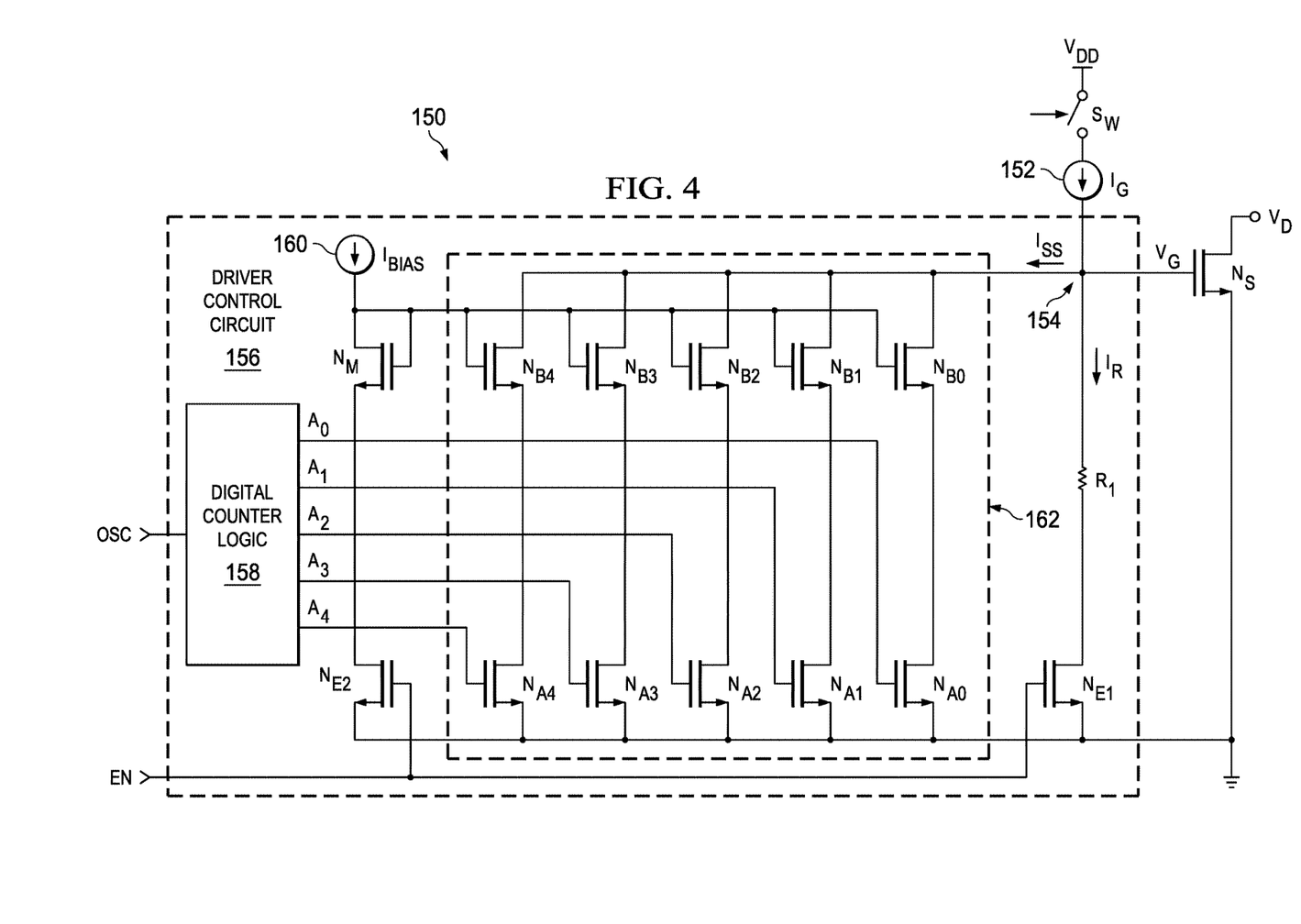
FIG. 4 illustrates another example of a switch circuit.

FIG. 4 illustrates another example of a switch circuit 150. The switch circuit 150 can correspond to one of the switch circuits 102 and 104 in the example of FIG. 3. Therefore, reference is to be made to the example of FIG. 3 in the following description of the example of FIG. 4.

The switch circuit 150 includes a current supply 152 that is configured to provide an activation current $I_G$ (e.g., one of the activation currents $I_{G1}$ and $I_{G2}$) from the power rail voltage $V_{DD}$ via a switch SW. As an example, the switch SW is controlled via one binary state of the oscillator signal OSC. The activation current $I_G$ is provided to an activation terminal (i.e., gate) 154 of an N-FET $N_S$ that can correspond to the transistor 12 in the example of FIG. 1, or one of the N-FETs $N_1$ and $N_2$ in the example of FIG. 3. As described herein, the activation current $I_G$ is provided to set an amplitude of an activation voltage $V_G$ at the gate of the N-FET $N_S$ gradually during a soft-start of the N-FET $N_S$. The N-FET $N_S$ is arranged with the voltage $V_D$, which can correspond to one of the voltages $V_{D1}$ and $V_{D2}$ in the examples of FIGS. 2 and 3, at a drain, and a low-voltage rail, demonstrated as ground, at a source. Therefore, the N-FET $N_S$ can be activated to conduct a primary current $I_{PRI}$ to ground in a power supply system.

The switch circuit 150 further includes a driver control circuit 156 that is configured to control the activation of the N-FET $N_S$ via the activation voltage $V_G$ to provide the soft-start of the N-FET $N_S$. The driver control circuit 156 includes digital counter logic 158 that is provided the oscillator signal OSC and is configured to generate a set of digital activation signals that correspond to a binary code. In the example of FIG. 4, the digital activation signals are demonstrated as signals $A_0$, $A_1$, $A_2$, $A_3$, and $A_4$ corresponding to a five-bit binary code in order from least significant bit to most significant bit. Therefore, the binary code represented by the digital activation signals $A_0$, $A_1$, $A_2$, $A_3$, and $A_4$ has a value between thirty-one at the beginning of the sequence, corresponding to assertion of all of the digital activation signals $A_0$, $A_1$, $A_2$, $A_3$, and $A_4$, to zero at the end of the sequence, corresponding to de-assertion of all of the digital activation signals $A_0$, $A_1$, $A_2$, $A_3$, and $A_4$. The digital counter logic 158 is thus configured as a five-bit counter to generate the digital activation signals $A_0$, $A_1$, $A_2$, $A_3$, and $A_4$ in a binary counting sequence from thirty-one to zero based on the oscillator signal OSC, and thus cycling through the thirty-two values of the digital activation signals $A_0$, $A_1$, $A_2$, $A_3$, and $A_4$ in a timed sequence.

The driver control circuit 156 also includes a first enable transistor $N_{E1}$ and a second enable transistor $N_{E2}$ that are each controlled by an enable signal EN, which can correspond to one of the enable signals $EN_1$ and $EN_2$ in the example of FIG. 3. The first enable transistor $N_{E1}$ is in series with a resistor $R_1$ in a first current path associated with the activation current $I_G$ between the activation terminal 154 and ground. The first current path conducts a current $I_R$ that is a first portion of the activation current $I_G$, such that the amplitude of the current $I_R$ through the resistor $R_1$ sets the amplitude of the activation voltage $V_G$, as described in greater detail herein. The second enable transistor $N_{E2}$ is arranged in series with a diode-coupled transistor $N_M$ between a current source 160 and ground to conduct a bias current $I_{BIAS}$ generated by the current source 160. As an example, the current source 160 can provide the bias current $I_{BIAS}$ based on the power rail voltage $V_{DD}$ or based on the activation current $I_G$. Therefore, in response to activation of the enable transistor $N_{E2}$ via the enable signal EN, the enable transistor $N_{E2}$ and the transistor $N_M$ are configured to conduct the bias current $I_{BIAS}$.

The driver control circuit 156 further includes a cascaded arrangement of transistors 162 that collectively correspond to a second current path associated with the activation current $I_G$ between the activation terminal 154 and ground. The second current path conducts a current $I_{SS}$ that is a second portion of the activation current $I_G$, such that the sum of the first current portion $I_R$ and the second current portion $I_{SS}$ is equal to the activation current $I_G$. The cascaded arrangement of transistors 162 includes a set of pairs of N-channel transistors that are each in series between the activation terminal 154 and ground, demonstrated as a first pair $N_{A0}$ and $N_{B0}$, a second pair $N_{A1}$ and $N_{B1}$, a third pair $N_{A2}$ and $N_{B2}$, a fourth pair $N_{A3}$ and $N_{B3}$, and a fifth pair $N_{A4}$ and $N_{B4}$. The transistors $N_{B0}$, $N_{B1}$, $N_{B2}$, $N_{B3}$, and $N_{B4}$ have gates that are coupled to the gate/drain of the transistor $N_M$, such that the bias current $I_{BIAS}$ is mirrored to the transistors $N_{B0}$, $N_{B1}$, $N_{B2}$, $N_{B3}$, and $N_{B4}$.

The transistors $N_{A0}$, $N_{A1}$, $N_{A2}$, $N_{A3}$, and $N_{A4}$ are activated, respectively, by the digital activation signals $A_0$, $A_1$, $A_2$, $A_3$, and $A_4$. As an example, each of the transistor pairs $N_{A0}$ and $N_{B0}$, $N_{A1}$ and $N_{B1}$, $N_{A2}$ and $N_{B2}$, $N_{A3}$ and $N_{B3}$, and $N_{A4}$ and $N_{B4}$ are arranged to have respective binary increases in size (e.g., gate width over gate length) from the first pair $N_{A0}$ and $N_{B0}$ to the fifth pair $N_{A4}$ and $N_{B4}$. For example, the first pair of transistors $N_{A0}$ and $N_{B0}$ can have a unit size W/L, the second pair of transistors $N_{A1}$ and $N_{B1}$ can have a size 2*W/L, the third pair of transistors $N_{A2}$ and $N_{B2}$ can have a size 4*W/L, the fourth pair of transistors $N_{A3}$ and $N_{B3}$ can have a size 8*W/L, and the fifth pair of transistors $N_{A4}$ and $N_{B4}$ can have a size 16*W/L. Therefore, in response to activation of one of the transistors $N_{A0}$, $N_{A1}$, $N_{A2}$, $N_{A3}$, and $N_{A4}$ by a respective one of the digital activation signals $A_0$, $A_1$, $A_2$, $A_3$, and $A_4$, the respective pair of the transistors in the cascaded arrangement of transistors 162 conducts a relative amplitude of current that corresponds to the bit of the binary code of the digital activation signals $A_0$, $A_1$, $A_2$, $A_3$, and $A_4$.

As described previously, the digital counter logic 158 is configured to generate the digital activation signals $A_0$, $A_1$, $A_2$, $A_3$, and $A_4$ in a binary counting sequence from thirty-one to zero based on the oscillator signal OSC. Therefore, the transistors $N_{A0}$, $N_{A1}$, $N_{A2}$, $N_{A3}$, and $N_{A4}$ are activated in the binary counting sequence to conduct a variable amplitude of the current $I_{SS}$, which in turn provides for a variable amplitude of the current $I_R$ to adjust the amplitude of the activation voltage $V_G$. As a result, the switch control circuit 156 is configured to decrease the amplitude of the current $I_{SS}$ from a maximum amplitude to a minimum amplitude at each digital count value of the digital counter logic 158, and conversely to increase the amplitude of the current $I_R$ from a minimum amplitude to a maximum amplitude at each digital count value of the digital counter logic 158.

As an example, the digital counter logic 158 can be configured to decrement the digital count value by one at each of 64 cycles of the oscillator signal OSC, such that the switches $SW_1$ and $SW_2$ are alternately activated sixty-four times each during each count value of the digital counter logic 158. Therefore, the driver control circuit 156 provides the activation voltage $V_G$ to conduct the primary current $I_{PRI}$ at the same amplitude sixty-four times before the digital counter logic 158 decrements the count value by one to decrease the amplitude of the current $I_{SS}$ by one discrete amount and to increase the amplitude of the current $I_R$ by an approximately equal discrete amount. Accordingly, the amplitude of the activation voltage $V_G$ increases by a discrete amount based on the change in amplitude of the currents $I_{SS}$ and $I_R$ at each 64 cycles of the oscillator signal OSC. For example, the oscillator signal OSC can have a frequency of approximately 100 kHz. To achieve a desired soft-start of the N-FET $N_S$ of approximately 20 milliseconds using a five-bit counter, the digital counter logic 158 can decrement the counter once every 0.625 milliseconds (i.e., 20 milliseconds/32 bits). Therefore, the frequency $F_1$ of the toggling of the least significant bit corresponding to the digital activation signal $A_0$ can be expressed as:

$$F_1 = 1/(2*0.625) = 800 \text{ Hz} \quad \text{Equation 1}$$

For a 100 kHz frequency of the oscillator signal OSC, and for the digital count value to be decremented by one at each 64 cycles of the oscillator signal OSC, each digital count value can have a time duration $T_D$ of:

$$T_D = (128/100 \text{ kHz})*0.5 = 0.64 \text{ milliseconds} \quad \text{Equation 2}$$

Because the last of the count values corresponds to all of the transistors $N_{A0}$, $N_{A1}$, $N_{A2}$, $N_{A3}$, and $N_{A4}$ being deactivated to provide the full soft-start time, the soft-start time $T_{SS}$ corresponds to thirty-one count values, as follows:

$$T_{SS} = 31*0.64 = 19.84 \text{ milliseconds} \quad \text{Equation 3}$$

Accordingly, the soft-start time $T_{SS}$ is close to the desired soft-start time of approximately 20 milliseconds.

Figure 5:
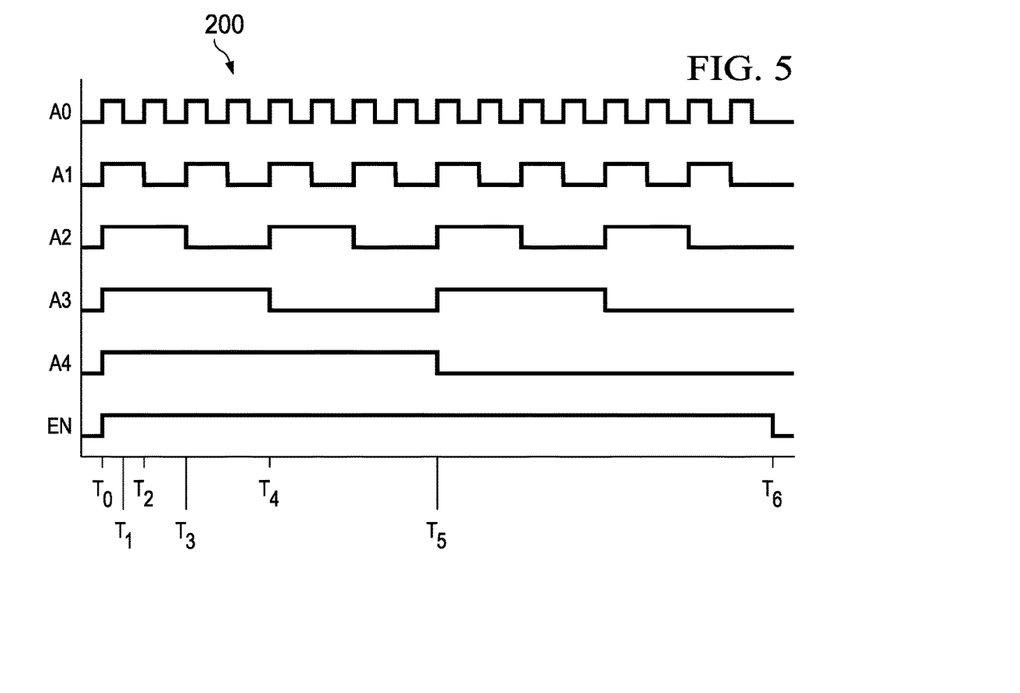
FIG. 5 illustrates an example of a timing diagram.
Figure 6:
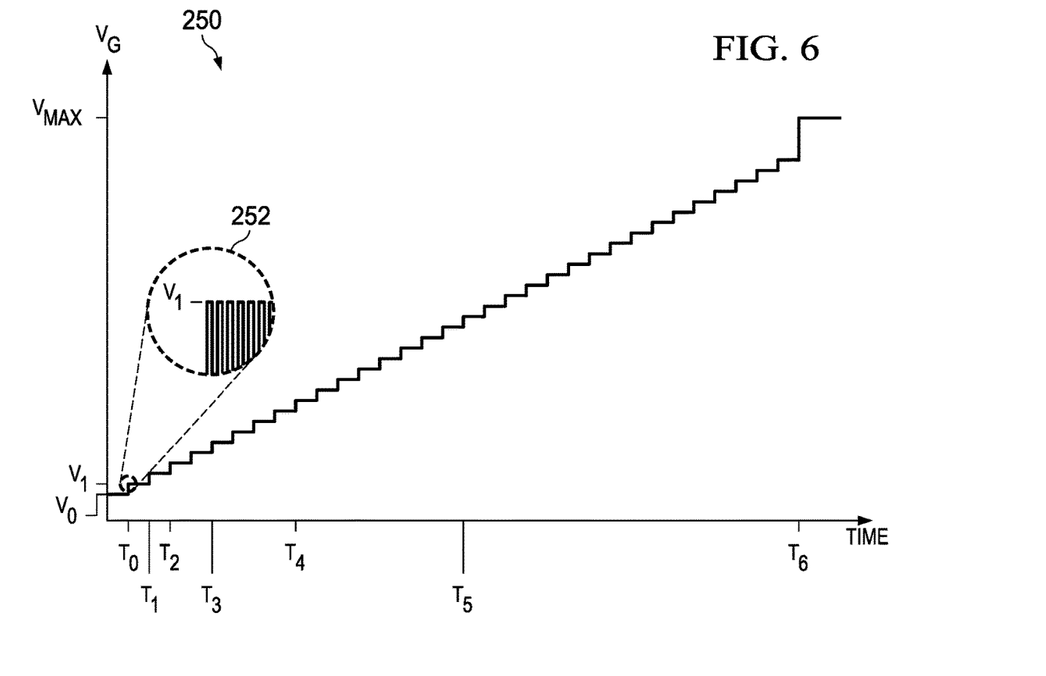
FIG. 6 illustrates another example of a timing diagram.

FIG. 5 illustrates an example of a timing diagram 200. The timing diagram 200 demonstrates the logic states of the digital activation signals $A_0$, $A_1$, $A_2$, $A_3$, and $A_4$, as well as the logic state of the enable signal EN, plotted as a function of time. FIG. 6 illustrates an example of a timing diagram 250. The timing diagram 250 demonstrates an amplitude of the activation voltage $V_G$ plotted as a function of time. The digital activation signals $A_0$, $A_1$, $A_2$, $A_3$, and $A_4$, the enable signal EN, and the activation voltage $V_G$ correspond to the digital activation signals $A_0$, $A_1$, $A_2$, $A_3$, and $A_4$, the enable signal EN, and the activation voltage $V_G$ of FIG. 4. Therefore, reference is to be made to the example of FIG. 4 in the following description of the examples of FIGS. 5 and 6. As an example, the timing diagrams 200 and 250 can demonstrate concurrent soft-start activations of the N-FETs $N_1$ and N-FET $N_2$ via each of the driver control circuits 108 and 114, respectively.

At a time $T_0$, the digital activation signals $A_0$, $A_1$, $A_2$, $A_3$, and $A_4$ are all asserted, as well as the enable signal EN. Thus, the digital code provided by the digital activation signals $A_0$, $A_1$, $A_2$, $A_3$, and $A_4$ is "11111", corresponding to the maximum value of "31". Therefore, the transistors $N_{40}$, $N_{41}$, $N_{42}$, $N_{43}$, and $N_{44}$ are all respectively activated, as are the enable transistors $N_{E1}$ and $N_{E2}$. Therefore, the current $I_{SS}$ has a maximum amplitude, resulting in the current $I_R$ having a minimum non-zero amplitude. Accordingly, at the time $T_0$, the activation voltage $V_G$ increases from a minimum activation amplitude of V0 by one discrete increment. Therefore, in response to activation of the switch SW by the oscillator signal OSC, the activation voltage $V_G$ has an amplitude $V_1$. In other words, as indicated at the exploded view 252, because the oscillator signal OSC activates the switch SW sixty-four times during each of the thirty-two count values, the activation voltage $V_G$ oscillates between zero and the amplitude $V_1$ at 128 times. At a time $T_1$, the count value provided by the digital counter logic 158 is decremented by one to provide the digital code corresponding to the digital activation signals $A_0$, $A_1$, $A_2$, $A_3$, and $A_4$ as "11110", corresponding to the value of "30". Thus, the transistor $N_{40}$ is deactivated to decrease the amplitude of the current $I_{SS}$ by one (W/L) unit amount, and thus to increase the current $I_R$ by the one (W/L) unit amount. Accordingly, at the time $T_1$, the activation voltage $V_G$ increases by another discrete increment.

Similarly, at the time $T_2$, the count value provided by the digital counter logic 158 is decremented by one to provide the digital code corresponding to the digital activation signals $A_0$, $A_1$, $A_2$, $A_3$, and $A_4$ as "11101", corresponding to the value of "29". Thus, the transistor $N_{40}$ is reactivated and the transistor $N_{41}$ is deactivated to decrease the amplitude of the current $I_{SS}$ by another one (W/L) unit amount, and thus to increase the current $I_R$ by another one (W/L) unit amount. Accordingly, at the time $T_2$, the activation voltage $V_G$ increases by another discrete increment. After the count value decrements twice more, at a time $T_3$, the count value provided by the digital counter logic 158 has decremented by two to provide the digital code corresponding to the digital activation signals $A_0$, $A_1$, $A_2$, $A_3$, and $A_4$ as "11011", corresponding to the value of "27". Accordingly, at the time $T_3$, the activation voltage $V_G$ has increased by two more discrete increments.

After the count value decrements four additional times, at a time $T_4$, the count value provided by the digital counter logic 158 has decremented by four more to provide the digital code corresponding to the digital activation signals $A_0$, $A_1$, $A_2$, $A_3$, and $A_4$ as "10111", corresponding to the value of "23". Accordingly, at the time $T_4$, the activation voltage $V_G$ has increased by four more discrete increments. Similarly, after the count value decrements eight additional times, at a time $T_5$, the count value provided by the digital counter logic 158 has decremented by eight more to provide the digital code corresponding to the digital activation signals $A_0$, $A_1$, $A_2$, $A_3$, and $A_4$ as "01111", corresponding to the value of "15". Accordingly, at the time $T_5$, the activation voltage $V_G$ has increased by eight more discrete increments. At a time $T_6$, the count value has decremented down sixteen additional times to end the count, such that the digital code corresponding to the digital activation signals $A_0$, $A_1$, $A_2$, $A_3$, and $A_4$ is "00000", corresponding to the value of "0". Therefore, all of the transistors $N_{40}$, $N_{41}$, $N_{42}$, $N_{43}$, and $N_{44}$ are deactivated. Concurrently at the time $T_6$, the enable signal is de-asserted to likewise deactivate the enable transistors $N_{E1}$ and $N_{E2}$. Accordingly, at the time $T_6$, the soft-start is complete, and the activation voltage $V_G$ has a maximum amplitude of $V_{MAX}$.

The operation of the switch circuit 150 in the examples of FIGS. 4-6 is provided by example, and it is thus contemplated that variations of the operation of the switch circuit 150 can be implemented. For example, the transistor 12 can be implemented as a P-channel transistor, such that the count value provides for sequential activation of the cascaded arrangement of the transistors 162 (e.g., likewise arranged as P-FETs) to provide for an incremental decrease of the current $I_R$ to provide the soft-start of the P-channel transistor 12. In addition, it is to be understood that the cascaded arrangement of transistors 162 is not limited to being arranged as a set of five transistors having a binary incremental increase in size. For example, the cascaded arrangement of transistors 162 can include more or less than the five pairs of transistors, and/or can be arranged with the same or different size relative to each other. For example, the soft-start can include less than thirty-two increments and more than five pairs of transistors in the cascaded arrangement of transistors 162. Therefore, each increment of the soft-start can be associated with activating an additional equally-sized one of the pairs of transistors in the cascaded arrangement of transistors 162. Accordingly, the switch circuits 10, 102 and 104, and 150 can be arranged in a variety of different ways.

In some examples, the driver control circuit may be coupled between the gate and source terminals of a transistor (or more generally between the control terminal and the current conduction terminal of a transistor). The driver control circuit may include circuitry configured to vary an effective resistance between the gate and source terminals of the transistor based on a control signal, such that the effective resistance increases with respect to time after a power-on event for the circuit. In some examples, the driver control circuit may include first and second current paths between the gate and the source of the transistor, the first current path may have a substantially fixed resistance, and the driver control circuit may be configured to vary a resistance of the second current path based on the control signal. In some examples, the first current path may be a resistor coupled between the gate and source of the transistor. In further examples, the second current path may be an adjustable current source that is coupled between the gate and source of the transistor and that is adjusted based on the control signal.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:
1. A switch circuit comprising:
  a transistor configured to activate in response to an activation voltage at an activation terminal of the transistor;
  a current source coupled to the activation terminal and being configured to generate an activation current; and
  a driver control circuit interconnecting the activation terminal and a voltage rail, the driver control circuit comprising digital counter logic configured to cycle through a predetermined number of count values based on an oscillator signal, the driver control circuit being configured to adjust an amplitude of the activation voltage at each of the predetermined number of count values based on the activation current to provide a soft-start activation of the transistor;

wherein the driver control circuit comprises a first current path for the activation current interconnecting the activation terminal and the voltage rail and a second current path for the activation current in parallel with the first current path, wherein the second current path is configured to conduct a variable portion of the activation current based on the digital counter logic to adjust the amplitude of the activation voltage.

2. A switch circuit comprising:
a transistor configured to activate in response to an activation voltage at an activation terminal of the transistor;
a current source coupled to the activation terminal and being configured to generate an activation current; and
a driver control circuit interconnecting the activation terminal and a voltage rail, the driver control circuit comprising digital counter logic configured to cycle through a predetermined number of count values based on an oscillator signal, the driver control circuit being configured to adjust an amplitude of the activation voltage at each of the predetermined number of count values based on the activation current to provide a soft-start activation of the transistor;
wherein the driver control circuit comprises a cascaded arrangement of transistors that are sequentially controlled by the digital counter logic to conduct a varying portion of the activation current at each of the predetermined number of count values to adjust the amplitude of the activation voltage;
wherein the digital counter logic is configured to generate a plurality of digital counter signals, and wherein the cascaded arrangement of transistors is arranged as a respective plurality of transistors that are controlled by the plurality of digital counter signals in a sequence based on the digital counter logic asserting the plurality of digital counter signals in a sequence based on the oscillator signal;
wherein the plurality of digital counter signals correspond to a respective plurality of bits of a binary code, wherein the respective plurality of transistors are arranged as having a binary increase in size from a first transistor of the cascaded arrangement of transistors to a last transistor of the cascaded arrangement of transistors, such that the plurality of transistors are controlled in a binary sequence between zero and a maximum binary number of the binary code to provide a number of sequential approximately equal increments of the activation voltage between zero and the maximum binary number.

3. A switch circuit comprising:
a transistor configured to activate in response to an activation voltage at an activation terminal of the transistor;
a current source coupled to the activation terminal and being configured to generate an activation current; and
a driver control circuit interconnecting the activation terminal and a voltage rail, the driver control circuit comprising digital counter logic configured to cycle through a predetermined number of count values based on an oscillator signal, the driver control circuit being configured to adjust an amplitude of the activation voltage at each of the predetermined number of count values based on the activation current to provide a soft-start activation of the transistor;
wherein the driver control circuit comprises a cascaded arrangement of transistors that are sequentially controlled by the digital counter logic to conduct a varying portion of the activation current at each of the predetermined number of count values to adjust the amplitude of the activation voltage;
wherein the cascaded arrangement of transistors comprises:
a first set of cascaded transistors coupled to the activation terminal and being arranged in a current mirror configuration with a first transistor to mirror a bias current that is provided through the first transistor; and
a second set of cascaded transistors that each interconnect a respective one transistor of the first set of cascaded transistors and is controlled by a respective digital activation signal generated by the digital counter logic to conduct a respective portion of the activation current to adjust the amplitude of the activation voltage.

4. A switch circuit comprising:
a transistor configured to activate in response to an activation voltage at an activation terminal of the transistor;
a current source coupled to the activation terminal and being configured to generate an activation current; and
a driver control circuit interconnecting the activation terminal and a voltage rail, the driver control circuit comprising digital counter logic configured to cycle through a predetermined number of count values based on an oscillator signal, the driver control circuit being configured to adjust an amplitude of the activation voltage at each of the predetermined number of count values based on the activation current to provide a soft-start activation of the transistor;
wherein the driver control circuit comprises a cascaded arrangement of transistors that are sequentially controlled by the digital counter logic to conduct a varying portion of the activation current at each of the predetermined number of count values to adjust the amplitude of the activation voltage;
wherein the driver control circuit further comprises:
a first enable transistor controlled via an enable signal and configured to conduct a bias current that is mirrored to the cascaded arrangement of transistors; and
a second enable transistor that is arranged in series with a resistor in a parallel with respect to the cascaded arrangement of transistors and is controlled last with respect to the cascaded arrangement of transistors to conduct a portion of the activation current, such that the second enable transistor is controlled after each of the transistors in the cascaded arrangement of transistors is controlled to set the activation voltage to a final amplitude to activate the transistor.

5. A power supply system comprising: a transformer comprising a primary winding configured to conduct the primary current and a secondary winding configured to generate a secondary current in response to the primary current; and an output stage configured to generate an output voltage based on the secondary current; wherein the switch circuit is a first switch circuit, the transistor is a first transistor, the driver control circuit is a first driver control circuit, and the current source is a first current source that is activated via a first switch in response to a first state of the oscillator signal to provide soft-start activation of the first transistor via the first driver control circuit, wherein the power supply system further comprises: a second transistor configured to activate in response to a second activation voltage at an activation terminal of the second transistor; a second current source coupled to the activation terminal of the second transistor and which is activated via a second switch in response to a second state of the oscillator signal to generate a second activation current; and a second driver control circuit interconnecting the activation terminal of the second transistor and the voltage rail, the second driver control circuit comprising second digital counter logic configured to cycle through the predetermined number of count values based on the oscillator signal, the second driver control circuit being configured to adjust an amplitude of the second activation voltage at each of the predetermined number of count values based on the second activation current to provide a soft-start activation of the second transistor.

6. A switch circuit comprising:
a transistor configured to activate in response to an activation voltage at an activation terminal of the transistor;
a current source coupled to the activation terminal and being configured to generate an activation current; and
a driver control circuit interconnecting the activation terminal and a voltage rail, the driver control circuit comprising:
a first current path for the activation current interconnecting the activation terminal and the voltage rail; and
a second current path for the activation current in parallel with the first current path and being configured to conduct a variable portion of the activation current in response to an oscillator signal to adjust the amplitude of the activation voltage to provide a soft-start activation of the transistor.

7. The circuit of claim 6, wherein the driver control circuit comprises digital counter logic configured to cycle through a predetermined number of count values based on the oscillator signal to adjust an amplitude of the portion of the activation voltage through the second current path at each of the predetermined number of count values to adjust the amplitude of the activation voltage to provide a soft-start activation of the transistor.

8. The circuit of claim 7, wherein the driver control circuit comprises a cascaded arrangement of transistors that are sequentially controlled by the digital counter logic to conduct a varying portion of the activation current at each of the predetermined number of count values to adjust the amplitude of the activation voltage.

9. The circuit of claim 8, wherein the digital counter logic is configured to generate a plurality of digital counter signals, and wherein the cascaded arrangement of transistors is arranged as a respective plurality of transistors that are controlled by the plurality of digital counter signals in a sequence based on the digital counter logic asserting the plurality of digital counter signals in a sequence based on the oscillator signal.

10. The circuit of claim 9, wherein the plurality of digital counter signals correspond to a respective plurality of bits of a binary code, wherein the respective plurality of transistors are arranged as having a binary increase in size from a first transistor of the cascaded arrangement of transistors to a last transistor of the cascaded arrangement of transistors, such that the plurality of transistors are controlled in a binary sequence between zero and a maximum binary number of the binary code to provide a number of sequential approximately equal increments of the activation voltage between zero and the maximum binary number.

11. A power supply circuit of claim 6, wherein the switch circuit is a first switch circuit, the transistor is a first transistor, the driver control circuit is a first driver control circuit, and the current source is a first current source that is activated via a first switch in response to a first state of the oscillator signal to provide soft-start activation of the first transistor via the first driver control circuit, wherein the power supply system further comprises:
a second transistor configured to activate in response to a second activation voltage at an activation terminal of the second transistor;
a second current source coupled to the activation terminal of the second transistor and being configured to generate a second activation current; and
a second driver control circuit interconnecting the activation terminal of the second transistor and the voltage rail, the second driver control circuit comprising:
a first current path for the second activation current interconnecting the activation terminal of the second transistor and the voltage rail; and
a second current path for the second activation current in parallel with the first current path for the second activation current and being configured to conduct a variable portion of the second activation current in response to the oscillator signal to adjust the amplitude of the second activation voltage to provide a soft-start activation of the second transistor.

12. A power supply circuit comprising:
a driver circuit comprising at least one switch circuit, each of the at least one switch circuit comprising:
a transistor configured to activate in response to an activation voltage at an activation terminal of the transistor to provide a primary current through the transistor;
a current source coupled to the activation terminal and being configured to generate an activation current; and
a driver control circuit interconnecting the activation terminal and a voltage rail, the driver control circuit comprising digital counter logic configured to cycle through a predetermined number of count values based on an oscillator signal, the driver control circuit being configured to adjust an amplitude of the activation voltage at each of the predetermined number of count values based on the activation current to provide a soft-start activation of the transistor; and
a transformer comprising a primary winding configured to conduct the primary current and a secondary winding configured to generate a secondary current in response to the primary current; and
an output stage configured to generate an output voltage based on the secondary current.

13. The circuit of claim 12, wherein the driver control circuit comprises a first current path for the activation current interconnecting the activation terminal and the voltage rail and a second current path for the activation current in parallel with the first current path, wherein the second current path is configured to conduct a variable portion of the activation current based on the digital counter logic to adjust the amplitude of the activation voltage.

14. The circuit of claim 12, wherein the driver control circuit comprises a cascaded arrangement of transistors that are sequentially controlled by the digital counter logic to conduct a varying portion of the activation current at each of the predetermined number of count values to adjust the amplitude of the activation voltage.

15. The circuit of claim 12, wherein the at least one switch circuit comprises a first switch circuit configured to generate a first primary current in response to a first state of the oscillator signal and a second switch circuit configured to generate a second primary current in response to a second state of the oscillator signal, wherein the transformer is configured to generate the secondary current in a first direction in response to the first primary current and in a second direction opposite the first direction in response to the second primary current, wherein the output stage comprises a rectifier configured to rectify the secondary current to generate the output voltage.

\* \* \* \* \*